United States Patent
Wolke et al.

(10) Patent No.: US 8,482,278 B2
(45) Date of Patent: Jul. 9, 2013

(54) METHOD OF POSITIONING AND ALIGNING WITH PRECISION, A SMALL ANIMAL IN ORDER TO CONDUCT AND PERFORM MRI MEASUREMENTS

(75) Inventors: Dietmar Wolke, Zurich (CH); Daniel Schmidig, Schaffhausen (CH)

(73) Assignee: Bruker BioSpin AG, Faellanden (CH)

( * ) Notice: Subject to any disclaimer, the term of this patent is extended or adjusted under 35 U.S.C. 154(b) by 514 days.

(21) Appl. No.: 12/585,671

(22) Filed: Sep. 22, 2009

(65) Prior Publication Data
US 2010/0072999 A1 Mar. 25, 2010

(30) Foreign Application Priority Data
Sep. 23, 2008 (DE) .................. 10 2008 048 414

(51) Int. Cl.
*G01R 33/30* (2006.01)
*G01R 33/307* (2006.01)
(52) U.S. Cl.
USPC ............................ 324/307; 324/309; 324/318
(58) Field of Classification Search
USPC .... 324/300–322; 382/128–131; 600/407–435
See application file for complete search history.

(56) References Cited

U.S. PATENT DOCUMENTS

| 4,629,989 | A | * | 12/1986 | Riehl et al. | .................... | 324/318 |
| 4,680,548 | A | | 7/1987 | Edelstein | | |
| 6,275,723 | B1 | | 8/2001 | Ferris | | |
| 6,711,430 | B1 | | 3/2004 | Ferris | | |
| 6,879,852 | B1 | * | 4/2005 | Mueller | ........................ | 600/410 |
| 6,989,674 | B2 | * | 1/2006 | Wind et al. | ..................... | 324/321 |
| 7,378,848 | B2 | | 5/2008 | Gao | | |
| 7,414,403 | B2 | * | 8/2008 | Chiodo | .......................... | 324/321 |
| 2001/0053878 | A1 | | 12/2001 | Ferris | | |
| 2003/0088175 | A1 | | 5/2003 | Branch | | |
| 2004/0216737 | A1 | * | 11/2004 | Anderson et al. | ........ | 128/203.12 |
| 2005/0027190 | A1 | | 2/2005 | Chiodo | | |
| 2005/0035766 | A1 | * | 2/2005 | Wind et al. | .................... | 324/322 |
| 2006/0135940 | A1 | * | 6/2006 | Joshi | .............................. | 604/500 |
| 2007/0232894 | A1 | | 10/2007 | Feenan | | |
| 2007/0257674 | A1 | | 11/2007 | Gao | | |
| 2008/0204023 | A1 | | 8/2008 | Du | | |
| 2010/0072999 | A1 | * | 3/2010 | Wolke et al. | .................. | 324/309 |

FOREIGN PATENT DOCUMENTS

| DE | 10 2006 008724 | 11/2007 |
| WO | WO 94/28431 | 12/1994 |

OTHER PUBLICATIONS

Driehuys B. et al. "Small Animal Imaging with Magnetic Resonance Microscopy", In: ILAR Journal, 2008, vol. 49, 1, Pa. 35-53.

* cited by examiner

*Primary Examiner* — Melissa Koval
*Assistant Examiner* — Tiffany Fetzner
(74) *Attorney, Agent, or Firm* — Paul Vincent (57) ABSTRACT

A device used in performing imaging magnetic resonance measurements (=MRI) in a Region of Interest (ROI) (9) of a small animal (3) with an MRI magnet system (7), with a cradle (5) on which the small animal (3) is lying, and with a radio-frequency (=RF) antenna (6), wherein the RF antenna (6) and the small animal (3) can be positioned relative to each other, characterized in that the device comprises a slide (1) on which the cradle together with the small animal immobilized thereupon can be moved both outside and inside the MRI magnet system, and characterized in that the RF antenna is rigidly fixed on the slide. This results in a device for the relative positioning of the small animal with respect to the RF antenna for an MRI measurement, which is easy to retrofit on existing tomography equipment, with which this positioning can be implemented both inside and outside the MRI magnet by simple handling and without great additional technical effort.

21 Claims, 5 Drawing Sheets

METHOD OF POSITIONING AND ALIGNING WITH PRECISION, A SMALL ANIMAL IN ORDER TO CONDUCT AND PERFORM MRI MEASUREMENTS

This application claims Paris Convention priority of DE 10 2008 048 414.8 filed Sep. 23, 2008 the complete disclosure of which is hereby incorporated by reference.

BACKGROUND OF THE INVENTION

The invention relates to a device used in the performance of MRS (magnetic resonance spectroscopy) and MRI (magnetic resonance imaging) experiments on small animals. In particular, the invention relates to a device and a method for positioning the small animal simply and precisely with respect to the radio-frequency (RF) antenna, an 'antenna' being a device for transmitting and receiving electromagnetic waves.

When a patient or an animal, hereinafter always referred to as "test object," is placed in a strong magnetic field, the tissue of the test object is magnetized due to the behavior of certain atomic nuclei. This nuclear magnetic field has a component that rotates at a specific frequency. This phenomenon is known as nuclear magnetic resonance (NMR). The resonance frequency is proportional to the strength of the strong magnetic field and is termed the Larmor frequency. Practically all clinical applications of magnetic resonance (MR) are based on the manipulation of the nuclear magnetic field of hydrogen, which at a field strength of 1.5 Tesla has a Larmor frequency of 63.87 MHz. The MR image is a representation of the NMR signal intensity. To provide a useful image, different tissue types must produce different signal intensities (contrast). For this, the MRI scanner must firstly generate detectable NMR signals in the tissue, and secondly, be able to resolve them spatially.

MRI systems are widely used medical and diagnostic apparatus. The primary components of an MRI system are the magnet, which generates a stable and very strong magnetic field (B0), the gradient coils, which generate an additional variable magnetic field, and the RF transmitter antenna, which is used to transmit energy into the test object and encode the spatial position. RF reception antennas are used to receive the NMR signal from the test object. It is possible to use an RF antenna both as a reception and as a transmission antenna. A computer controls the entire procedure and is required to process the information received.

A Region of Interest (ROI) will hereafter be used to designate an area of the test object that is of particular significance. This might be, for example, an organ or a body part of a small animal to be examined.

Let the Field of View (FOV) define the size of the region within which a sufficiently strong signal is generated by the RF antenna. Anything that lies outside the FOV of an RF antenna cannot be represented in the MR image.

The Signal to Noise Ratio (SNR) is a criterion for the image quality in magnetic resonance tomography. The SNR is the ratio between the effective NMR signal acquired by the MRI system and the random noise signals acquired by the MRI system.

The RF antenna systems of MRI devices fall into two categories. One category contains antenna systems that use the same RF antenna to send and to transmit, termed transmit-receive antennas.

The second category contains antenna systems that use separate RF antennas to send and to transmit RF signals, one RF antenna to transmit RF signals, termed transmit antenna, and one RF antenna to receive NMR signals, termed receive antenna.

In the case of MR examinations of the organs or body parts of small animals, RF antennas that are adapted to the geometry of the ROI are increasingly being used to receive nuclear magnetic resonance signals (MR signals). These RF antennas are positioned as closely as possible to the body surface directly at the organ or body part of the small animal being examined. In contrast to RF antenna that are positioned at a greater distance from the small animal, which are usually used to produce a cross-section of the entire small animal, RF antennas of this type are considerably smaller in their geometrical dimensions. This reduces the noise component caused by the dielectric losses inside the body of the small animal, which means that the SNR of an RF antenna adapted to the geometry of the ROI is, in principle, better than that of a more remote antenna. The disadvantage, however, is that a smaller RF antenna is only able to generate an image within a limited spatial extent, which approximately corresponds to the typical dimensions of the RF antenna.

The RF antennas described above, which are adapted to the geometry of the ROI, are frequently surface coils or so-called phased array coils. The information given above, however, applies nonetheless also to coil types such as birdcage, solenoid, Helmholtz coils, and strip line antennas.

A surface coil is understood to be a coil of conducting material that functions as an RF antenna and that is in direct contact with the test object.

A phased array coil is an arrangement of several RF antennas that are operated in parallel.

Birdcage coils are known, for example, from U.S. Pat. No. 4,680,548. Their two ladder loops usually have the shape of two equally sized coaxial circles that are connected to each other by the ladder. This structure lends the MR coil arrangement the appearance of a birdcage, which is why the coil arrangement is commonly referred to as a "birdcage coil" among specialists.

Reducing the size of the RF antenna results in one essential problem:

Because the FOV of a smaller RF antenna is smaller in accordance with the dimensions of the RF antenna, it is correspondingly more difficult to position the small animal with respect to the RF antenna such that the organ or body part to be examined (more general: the ROI) is located inside the FOV of the RF antenna. In particular, it is often necessary to position the RF antenna as close as possible to the small animal, as the intensity of the RF field decreases much more quickly in the case of smaller RF antennas. A rule of thumb states that the FOV of a surface coil extends a half coil diameter into the test object.

As a result, the positioning of small animals with respect to the RF antenna is becoming an increasingly important aspect.

Frequently, precise positioning of the ROI with respect to the RF antenna outside the magnet is not possible because the position of the ROI cannot be determined precisely enough without MR imaging. For example, if, in MR imaging of the region of the heart of small animals, the position of the heart is determined by feeling, this results in a positioning error of approx. ±5 mm.

Figure 6A:
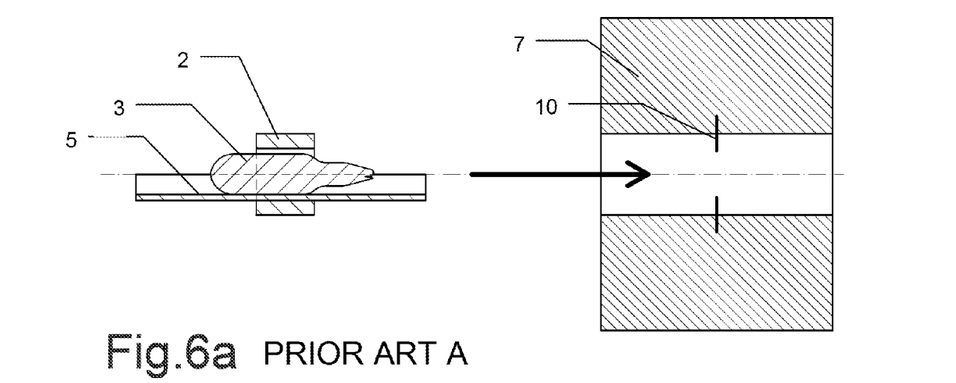
FIG. 6a Representation of the prior art, variant A

In prior art, this problem of positioning the small animal with respect to the RF antenna is essentially solved by two different means:

Type A:

FIG. 6a shows a typical device used in the prior art to position a small animal 3 with respect to an RF antenna. The small animal 3 is located in a cradle 5. The small animal 3 is immobilized in this cradle 5 either with a stereotactic fixing aid or with other aids, or it is positioned in cradle 5 without being immobilized. Essentially, however, the small animal 3 is moved together with the cradle 5. To position the RF antenna with respect to the small animal 3, the former is attached to cradle 5 by a particular method. The small animal 3 with cradle 5 and the RF antenna positioned with respect to it are now moved into the MRI magnet as a single unit. It is typical of this type of device that the relative position between the small animal 3 and the HF antenna cannot be changed once the device has moved inside the magnet.

U.S. Pat. No. 6,275,723 B1 describes a device for stereotactic immobilization of a small animal for MRI. It describes how this device can be positioned in the magnet and how an RF antenna can additionally be fixed on the device.

US 2001 053 878 A1 describes an immobilization facility for neuroimaging of animals in MRI systems, wherein the animal is fixed in a cradle together with a holder for the head of the animal. It is described how the holder for the head of the animal can contain an RF antenna.

The problem of conventional devices of Type A is that the relative position between the small animal and the RF antenna cannot be changed once the device is located inside the magnet. If the MR image shows that the RF antenna is not correctly positioned with respect to the animal because, for example, the position of the heart was not correctly felt, the device must be moved out of the magnet and the animal repositioned with respect to the RF antenna outside the magnet.

Type: B

Figure 6B:
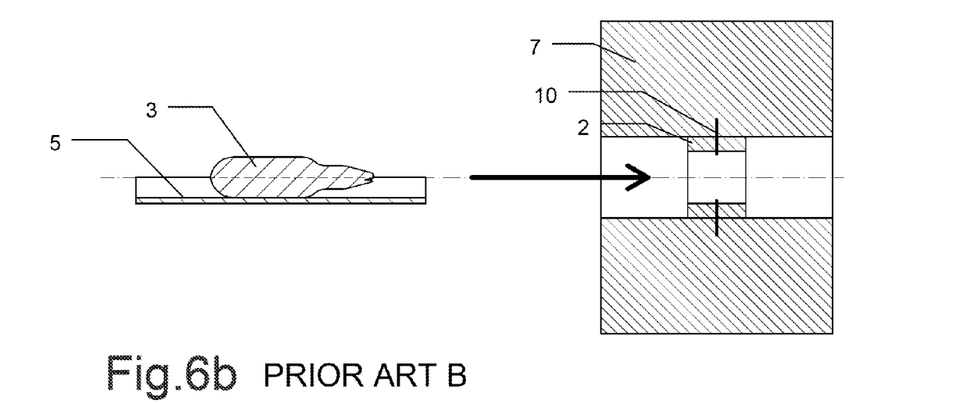
FIG. 6b Representation of the prior art, variant B

FIG. 6b shows a second typical device, which is the prior art for positioning a small animal 3 with respect to an RF antenna. The small animal 3 is located in a cradle 5. The small animal 3 is immobilized in this cradle 5 either with a stereotactic fixing aid or with other aids, or it is positioned in cradle 5 without being immobilized. Essentially, however, the small animal 3 is moved together with the cradle 5, wherein the RF antenna is not permanently fixed to cradle 5 but is located inside the MRI magnet. To position the RF antenna with respect to small animal 3, the cradle 5 together with the small animal 3 is introduced into the MRI magnet 7 and the RF antenna. The relative position of the small animal 3 with respect to the RF antenna can be changed inside the magnet by moving the cradle 5. It is typical of this type of device that the small animal and the RF antenna cannot be positioned relative to each other outside the magnet.

US 2005 027 190 A1 describes a system that simplifies the imaging of a test object in an MRI system. The system comprises, among other components, supports that simplify mounting of the RF antenna in the magnet. The publication also describes a device for the radial and axial positioning of a small animal holder with respect to the RF antenna. However, no provision is made for the preparation of the animal together with the RF antenna outside the magnet.

WO 94 28 431 A1 describes a device for radial and axial positioning of a small animal holder and of an RF antenna with respect to the magnet system without provision for moving the animal into the magnet together with the RF antenna.

Conventional devices of Type B pose the problem that the relative positioning of the test object with respect to the RF antenna outside the magnet cannot be monitored. But in work with live animals or when the small animal must be positioned as close to the RF antenna as possible, the possibility of monitoring this positioning outside the magnet is of great importance. If positioning can only be performed inside the magnet and cannot thus be verified visually, there is a danger that the small animal may be injured.

The object of this invention is to present a device, with which it may be possible to retrofit an existing tomography apparatus, for the relative positioning of a small animal with respect to an RF antenna for an MRI measurement, wherein this positioning can be effected both inside and outside the MRI magnet, with easy handling and without great additional technical effort.

SUMMARY OF THE INVENTION

This object is inventively achieved by adding a slide to the cradle on or in which the small animal is located, on which the cradle can be moved both inside and outside the MRI magnet, wherein the RF antenna is permanently fixed to the slide.

Figure 6C:
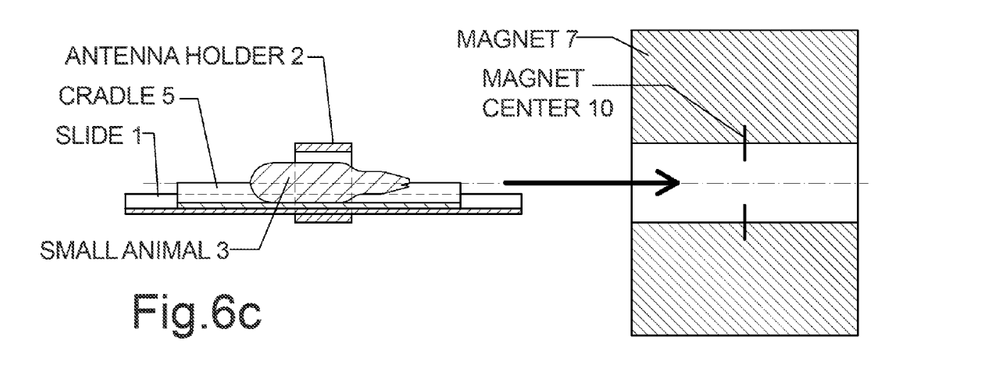
FIG. 6c Representation of the innovation in this invention

FIG. 6c presents an inventive device for positioning a small animal 3 with respect to an RF antenna fitted to an antenna holder 2. The small animal 3 is located in a cradle 5. The small animal 3 is immobilized in this cradle 5 either with a stereotactic fixing element or with other aids, or it is placed on this cradle 5 without fixing. The small animal can be moved together with the cradle 5. One essential component of the invention is an additional carrier element, the so-called slide 1, in which the cradle 5 is located and within which the cradle 5 can be moved. The small animal 3 is not connected to the slide 1. The RF antenna 6 is connected to the slide 1 via the antenna holder 2 and is not connected to the cradle 5 and the small animal 3. To position the RF antenna with respect to the small animal 3, the cradle 5 is moved within the slide 1. The small animal 3 is moved as one unit together with the cradle 5 and slide 1 and the RF antenna 6 connected to the latter into the MRI magnet 7. By moving the cradle 5 within the slide 1 it is possible to change the relative position of the small animal 3 with respect to the RF antenna even inside the MRI magnet 7.

The main advantage of positioning the small animal with respect to the RF antenna outside the magnet is that it is easy to verify the correct position of the animal visually. Moreover, it is possible to verify that the small animal is not injured when it is positioned close to the RF antenna. If the RF antenna were already inside the magnet and the small animal were positioned relative to the RF antenna therein, visual verification would not be possible.

The main advantage of positioning inside the magnet is that the position of the ROI can be verified and possibly corrected with an MR image without removing the small animal from the magnet.

Both the advantages of positioning outside and the advantages of positioning inside the magnet can be exploited to the full by means of the present invention.

In a preferred embodiment of the invention it is possible to position the small animal coarsely with respect to the RF antenna outside the magnet by immobilizing the small animal in the cradle accordingly.

Fine positioning inside the magnet is then effected by moving the cradle within the slide.

By 'coarse positioning,' we mean a positioning precision of ±1 cm; by 'fine positioning,' a positioning precision of ±0.5 mm.

The way in which this invention is implemented is described in detail below. This explanation is not intended to restrict this invention to precisely this mode of implementation.

DESCRIPTION OF THE PREFERRED EMBODIMENT

Figure 1:
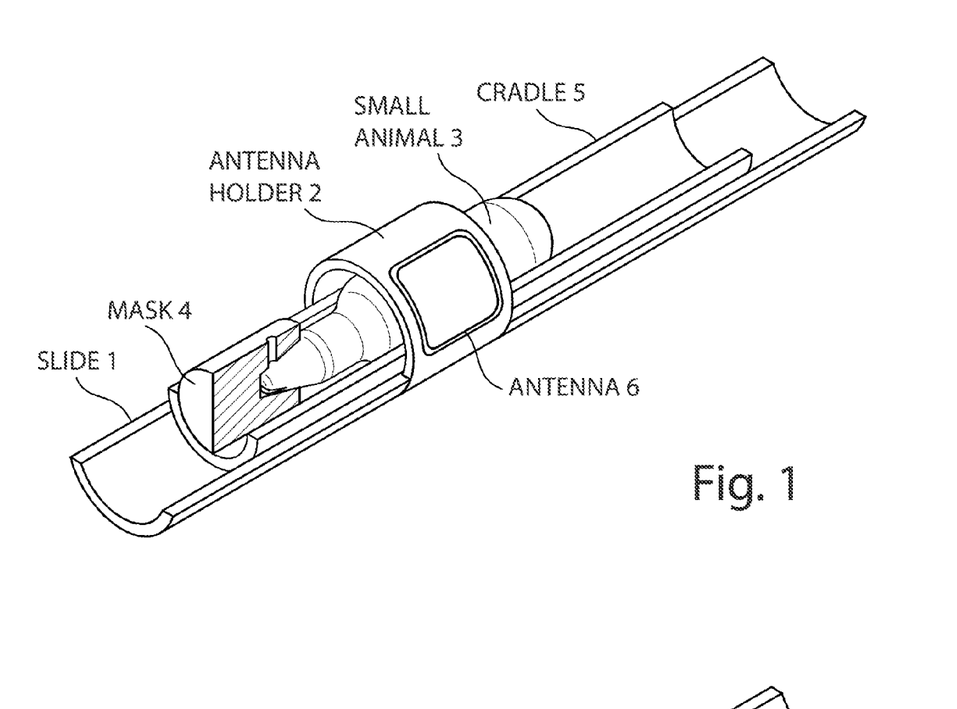
FIG. 1 Inventive device with cross-section through the anesthetic mask

The basic design of an inventive device for the relative positioning of a small animal 3 with respect to an RF antenna 6 is illustrated in FIG. 1. As FIG. 1 shows, the inventive device comprises three main components, that is, the cradle 5, the slide 1, and the RF antenna 6 attached to an antenna holder 2.

The cradle 5 is used to support the small animal 3, that is, the small animal 3 is coarsely positioned in the cradle 5 and immobilized, if necessary. To position the small animal 3 in the cradle 5 coarsely, the latter can be furnished with a marking indicating the magnetic center. This marking refers to the zero position of the cradle 5 with respect to the slide 1.

The slide 1 is used to hold the cradle 5, that is, the cradle 5 is located in the slide 1 and can be moved relative to it. A scale that can be applied to the slide 1 makes it possible to read off the relative position of the cradle 5 to the slide 1.

Figure 2:
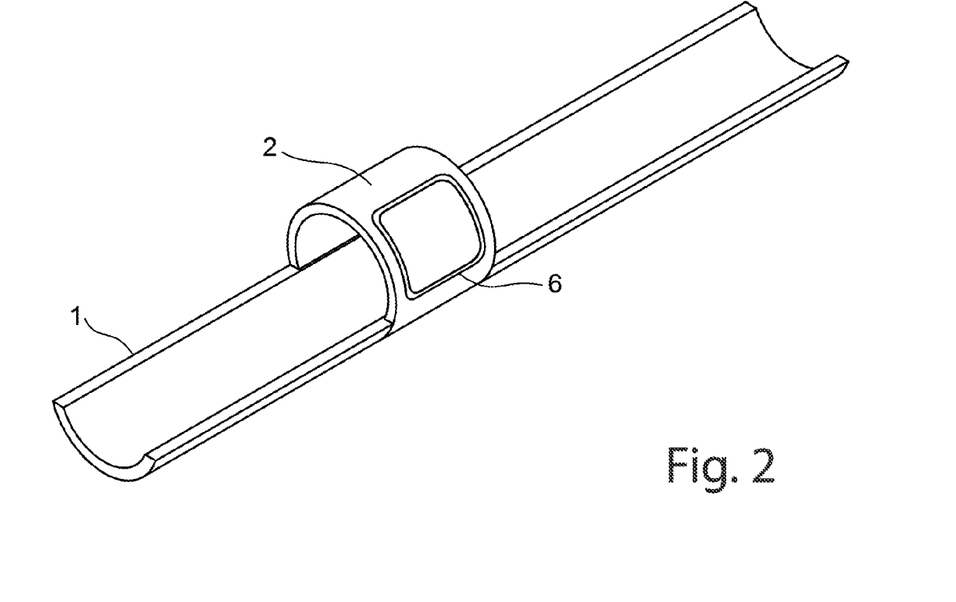
FIG. 2 Slide with RF antenna holder and RF antenna

FIG. 2 shows the RF antenna 6 in the slide 1. The RF antenna 6 is permanently integrated in slide 1 via the antenna holder 2 or rigidly fixed to the slide 1 by some other means. A surface coil, a strip line antenna, or a phased array antenna can be used as an RF antenna. The RF antenna 6 can either be used exclusively as a receive antenna, in which case a second antenna is implemented for generating an RF transmission signal. The latter can either be mounted permanently in the MRI magnet 7 or fixed on the slide 1 together with the receive antenna. Alternatively, the RF antenna 6 can be designed in such a way that it is possible to transmit and receive with it.

Volume coils refer to RF antennas that cover a larger area with a largely homogenous B1 field. These include the so-called birdcage resonators, Helmholtz coils, and solenoid coils. In special cases, it may also be advisable to use the inventive device with so-called volume coils.

Electronic components used to adapt the impedance of the coil, the so-called tuning network of the RF antenna 6 and the accompanying RF leads, are incorporated directly in slide 1.

Before the NMR signal received from the RF antenna 6 can be further processed, it must be amplified. This is performed by one or more levels of pre-amplifiers that are incorporated directly in slide 1.

Figure 3:
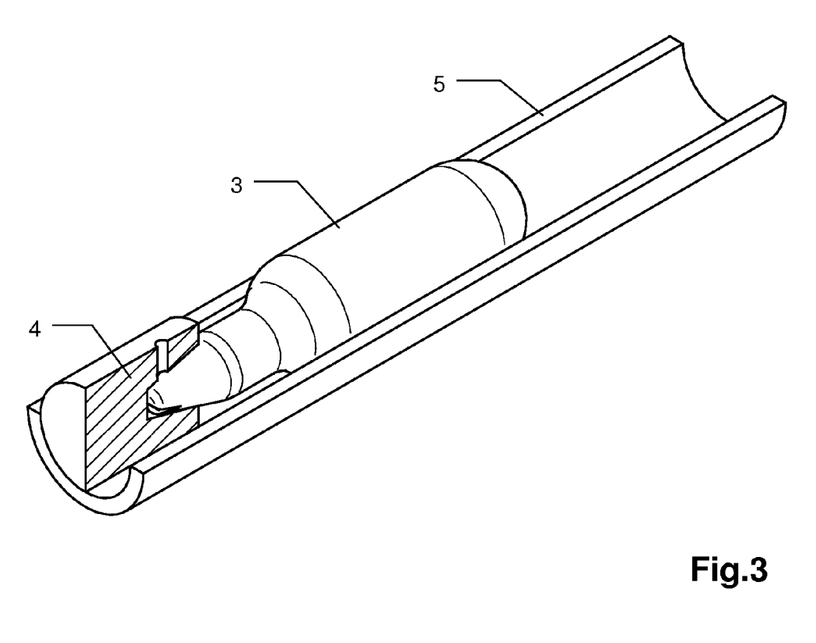
FIG. 3 Cradle with cross-section through the anesthetic mask

FIG. 3 shows how the small animal 3 is immobilized in the cradle 5 with an immobilization facility. Immobilization can either be effected with a stereotactic immobilization facility or a simple rack rail mechanism with which the small animal 3 is held in position.

By moving the immobilization facility along the cradle 5, the relative position between the small animal 3 and the cradle 5 can be set. The immobilization facility can be held in the final position on the cradle 5 in order to prevent the immobilization facility from shifting involuntarily with respect to the cradle 5 and to attach the small animal 3 firmly with the cradle 5.

The inventive device can feature a temperature control facility for the small animal 3. In a preferred further embodiment, the temperature control facility comprises a channel, which meanders through the cradle 5. A temperature-controlled thermal medium which takes the cradle 5 in the region of the small animal 3 to the desired temperature flows through the channel.

Embodiments of the inventive device can comprise an anesthetic gas line which is preferably integrated. The anesthetic gas flows through a channel constituted in the cradle 5 to the immobilization facility of the small animal 3. The anesthetic gas is fed to the small animal 3 via an anesthetic mask 4, which simultaneously serves to immobilize the small animal 3.

The inventive device can constitute an integrated signal cable for a temperature sensor. The cable of the temperature sensor is then preferably integrated directly in cradle 5.

The RF antenna 6 that is part of the inventive device should match the ROI 9 in terms of size and shape.

In the inventive device, the cradle 5 can be moved in the slide 1 axially and/or radially. An anti-rotation element can be additionally implemented on a slide 1 that moves axially.

The components of the inventive device should be made of non-magnetic material to guarantee homogeneity of the B0. A susceptibility of between −15 ppm and +15 ppm is deemed to be non-magnetic in this case.

In preferred embodiments, the cradle 5 can be automatically moved in slide 1.

Further embodiments in which the cradle 5 in slide 1 is automatically moved with remote control are also preferable. This has the advantage that the operator of the MRI system can correct the relative position of the small animal 3 and the RF antenna 6 directly at the workstation where the MR image data are displayed.

The way in which a method for positioning the small animal 3 relative to the RF antenna 6 is performed is described below. The method described assumes that the inventive device is used. This description does not intend to limit the method or invention described here to precisely this type of implementation.

As a rule, the organ or body part to be examined of the small animal 3 is the ROI and is initially localized either visually or by feeling. Once the ROI has been localized, the operator can position the small animal 3 on the cradle 5 using markings on the cradle 5 in such a way that the ROI 9 on the cradle 5 is positioned at the marking of the magnetic center 10 of the MRI magnet system 7. The small animal 3 is immobilized in this position on the cradle 5 with the immobilization facility. Finally, the cradle 5 is placed in the slide 1 and coarsely positioned relative to the RF antenna.

Figure 4:
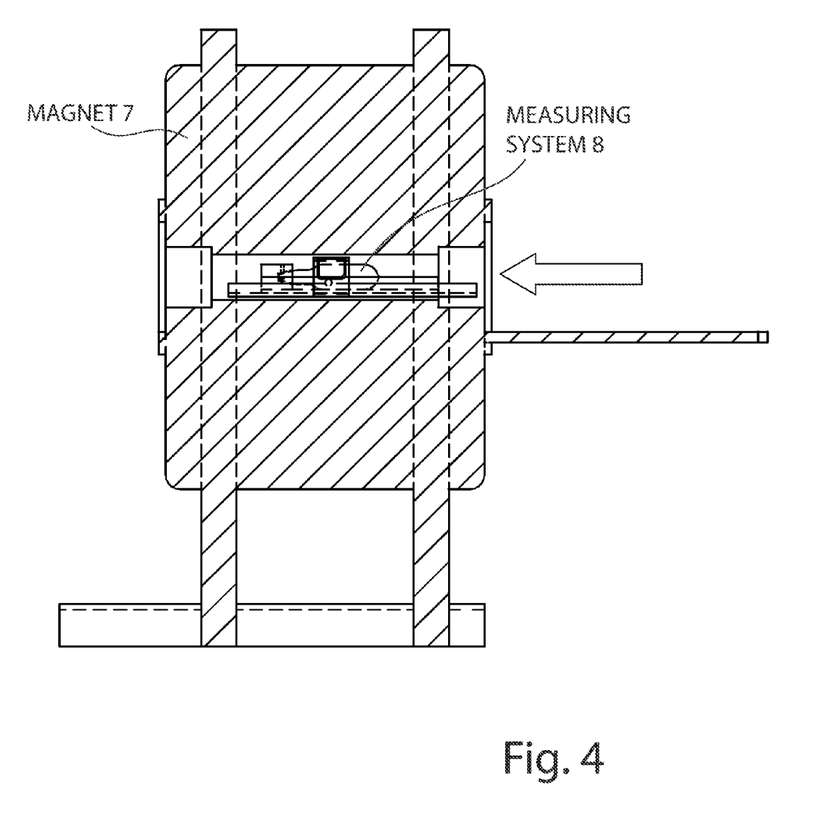
FIG. 4 Cross-section view through an MRI magnet with device inserted

The small animal 3 together with cradle 5 and slide 1 are, as illustrated in FIG. 4, introduced into the MRI magnet 7 as unit 8, wherein the slide 1 with the RF antenna 6 is positioned relative to the magnetic center 10 of the MRI magnet 7.

Figure 5A:
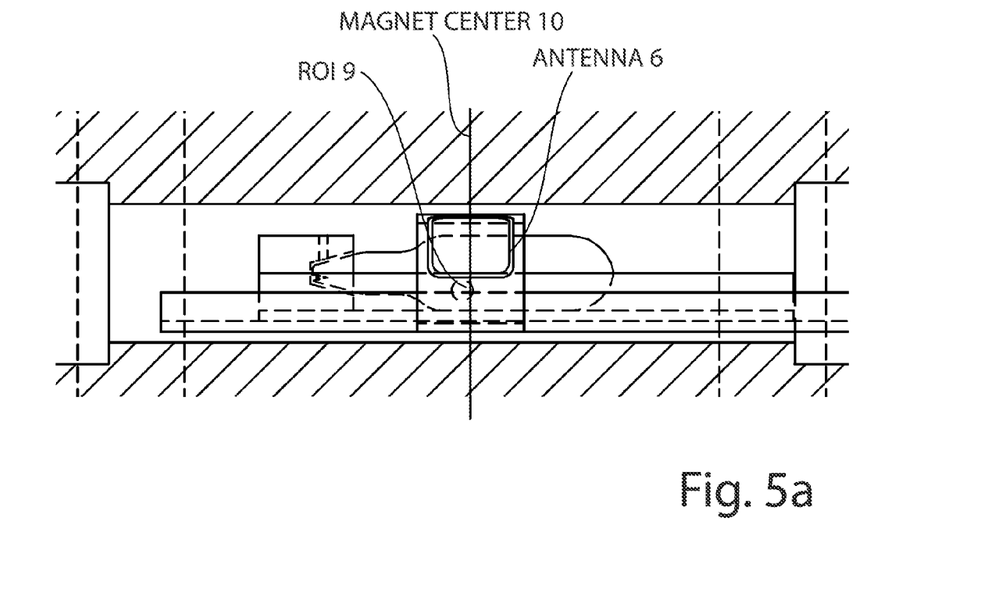
FIG. 5a Cross-section view through the magnet. The position of the heart of the animal has been determined. It is outside the magnetic center.
Figure 5B:
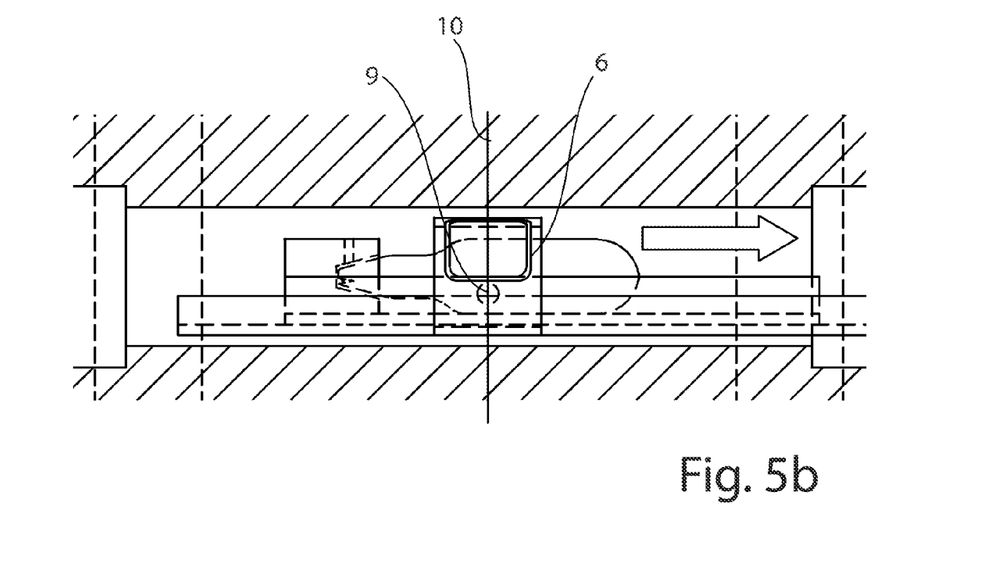
FIG. 5b Cross-section view through the magnet. The position of the heart of the animal has been corrected.

In this condition, an MRI experiment is performed. The offset of the ROI 9 relative to the center of the RF antenna 6 that coincides with the magnetic center 10 of the MRI magnet 7 in the measuring position can now be determined. In FIG. 5a, the illustrated case shows the ROI 9 offset relative to the magnetic center 10. Without moving the slide 1 out of the MRI magnet 7, the relative position of the ROI 9 with respect to the RF antenna 6 can now be altered by the value that can be read in the MR image as the offset value. For this, as FIG. 5b shows, the cradle 5 is offset by exactly that value within the slide 1. As a result, the ROI 9 is positioned in the center of the RF antenna 6.

The procedure for executing an MRI experiment and correcting the position inside the magnet is performed iteratively.

Once the relative position of the ROI 9 and the RF antenna 6 are correct, the final MR experiments can be performed.

LIST OF REFERENCES

1 Slide
2 RF antenna holder
3 Small animal
4 Anesthetic mask
5 Cradle
6 RF antenna
7 MRI magnet system
8 Overall measuring system
9 ROI
10 Magnetic center

We claim:

1. A method facilitating magnetic resonance imaging measurements (=MRI) in a region of interest (=ROI) of a small animal using an MRI magnet system, the method comprising:
   (1) outside of the MRI magnet system carrying out the steps of:
      a) fixing an RF antenna to a slide;
      b) placing the small animal on a cradle that is configured for holding the small animal;
      c) placing the cradle and the small animal onto the slide;
      d) positioning, following steps a), b), and c), the cradle relative to the slide in order to align the small animal relative to the RF antenna thereby achieving precision alignment of the small animal relative to the RF antenna;
      e) placing, following step d), the small animal, the cradle, the RF antenna and the slide, as an integral unit, within the inside of the MRI magnet system in order to subsequently align the small animal and the RF antenna relative to a homogenous magnetic field region of the MRI magnet system; and
   (2) inside the MRI magnet system carrying out the step of:
      f) performing, following step e), an MRI measurement on the small animal in order to:
         obtain MRI data of the small animal; and
         form an MRI image of the small animal from said obtained data.

2. The method of claim 1, further comprising the step of changing a position of the cradle relative to the slide, following step e) and prior to step f) in order to increase the precision of the alignment of the small animal relative to the RF antenna, when necessary.

3. The method of claim 1, wherein step d) is performed manually.

4. The method of claim 1, wherein step d) is performed automatically.

5. The method of claim 1, wherein step f) determines a position of the ROI of the small animal relative to said RF antenna.

6. A device configured for carrying out the method of claim 2, comprising:
   a slide;
   a radio frequency (=RF) antenna rigidly fixed to said slide; and
   a cradle on which the small animal lies in an immobilized manner, said cradle seating on said slide, wherein said slide and said cradle are disposed, structured, and dimensioned such that said cradle is capable of being adjusted and aligned relative to said slide and said RF antenna both inside and outside of the MRI magnet system.

7. The device of claim 6 that is configured for carrying out the method of claim 2,
   wherein said RF antenna is a reception antenna and further comprising:
      a second RF antenna in order to generate an RF transmission signal.

8. The device of claim 6 that is configured for carrying out the method of claim 2,
   wherein said RF antenna transmits and receives.

9. The device of claim 6 that is configured for carrying out the method of claim 2,
   wherein said RF antenna is a phased array coil, a surface coil, a birdcage coil, a solenoid coil, a Helmholtz coil, or a strip line antenna.

10. The device of claim 6 that is configured for carrying out the method of claim 2,
    wherein at least one of a signal cable that connects said RF antenna to one or more pre-amplifiers, a pre-amplifier, and a tuning network is integrated in said slide.

11. The device of claim 6 that is configured for carrying out the method of claim 2,
    wherein said cradle is capable of being axially offset in said slide.

12. The device of claim 6 that is configured for carrying out the method of claim 2,
    wherein said cradle is capable of being radially offset in said slide.

13. The device of claim 11 that is configured for carrying out the method of claim 2,
    wherein said cradle is capable of being locked against rotation in said slide.

14. The device of claim 6 that is configured for carrying out the method of claim 2,
    wherein components of the device exhibit a maximum magnetic susceptibility of between −15 ppm and +15 ppm.

15. The device of claim 6 that is configured for carrying out the method of claim 2,
    further comprising supply tubes or an anesthetic gas line cooperating with said slide.

16. The device of claim 6 that is configured for carrying out the method of claim 2,
    further comprising an anesthetic mask with which the small animal is supplied with anesthetic gas, wherein said anesthetic mask immobilizes the small animal.

17. The device of claim 6 that is configured for carrying out the method of claim 2,
    further comprising a means for monitoring the temperature of the small animal.

18. The device of claim 17 that is configured for carrying out the method of claim 2,
    further comprising a means for adjusting the temperature of the small animal.

19. The device of claim 18 that is configured for carrying out the method of claim 2,
    wherein said temperature adjusting means comprises:
       a channel which meanders through said cradle.

20. The device of claim 18 that is configured for carrying out the method of claim 2,
    wherein a temperature-controlled thermal medium flows through said temperature adjusting means.

21. The device of claim 6 that is configured for carrying out the method of claim 2,
  wherein a shape, size, and position on said slide of said RF antenna are structured to image an organ of the small animal.

* * * * *